United States Patent
Kameda et al.

(10) Patent No.: US 8,330,336 B2
(45) Date of Patent: Dec. 11, 2012

(54) PIEZOELECTRIC VIBRATION COMPONENT

(75) Inventors: Eitaro Kameda, Moriyama (JP); Toru Kizu, Moriyama (JP); Akihiro Mitani, Moriyama (JP); Hiroaki Kaida, Moriyama (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 12/794,144

(22) Filed: Jun. 4, 2010

(65) Prior Publication Data

US 2010/0231094 A1    Sep. 16, 2010

Related U.S. Application Data

(63) Continuation of application No. PCT/JP2008/068562, filed on Oct. 14, 2008.

(30) Foreign Application Priority Data

Dec. 6, 2007   (JP) ................. 2007-315409

(51) Int. Cl.
    *H01L 41/053*   (2006.01)
(52) U.S. Cl. ..................... 310/344; 310/370
(58) Field of Classification Search .......... 310/344, 310/370
    See application file for complete search history.

(56) References Cited

U.S. PATENT DOCUMENTS

| | | | | |
|---|---|---|---|---|
| 5,841,217 A * | 11/1998 | Kizaki et al. | ............... | 310/348 |
| 6,172,446 B1 | 1/2001 | Kanayama et al. | | |
| 6,396,201 B1 | 5/2002 | Ide et al. | | |
| 6,545,392 B2 * | 4/2003 | Kawauchi et al. | ............... | 310/344 |
| 7,279,824 B2 * | 10/2007 | Tanaya et al. | ............... | 310/344 |
| 2003/0076010 A1 * | 4/2003 | Ishino et al. | ............... | 310/348 |
| 2003/0209954 A1 * | 11/2003 | Kaida | ............... | 310/340 |
| 2004/0104643 A1 * | 6/2004 | Kawauchi et al. | ............... | 310/344 |
| 2009/0015108 A1 | 1/2009 | Ishimasa et al. | | |

FOREIGN PATENT DOCUMENTS

| | | |
|---|---|---|
| CN | 1197548 A | 10/1998 |
| JP | 9-36691 | 12/1978 |
| JP | 6-314928 | 8/1994 |
| JP | 9-181558 A | 7/1997 |
| JP | 10022777 A | 1/1998 |
| JP | 2002198741 A | 7/2002 |
| JP | 2002-198741 | 12/2002 |
| JP | 2004015604 A | 1/2004 |
| WO | WO-2005064989 A1 | 7/2005 |

OTHER PUBLICATIONS

Quartz Crystal Industry Association of Japan Gijutsu Iinkai, Suisho Device no Kaisetsu to Oyo, Mar. 2007, pp. 56 to 57.

* cited by examiner

*Primary Examiner* — Walter Benson
*Assistant Examiner* — Bryan Gordon
(74) *Attorney, Agent, or Firm* — Dickstein Shapiro LLP

(57) ABSTRACT

To obtain an inexpensive piezoelectric vibration component having vibration characteristics whose degradation resulting from deposition of moisture due to a temperature change is less likely to occur without increasing the cost of a sealing structure and the number of parts, a piezoelectric vibration component includes a piezoelectric vibrating element accommodated in a package being sealed, and when the volume of the piezoelectric vibrating element is Ve and the volume within the package obtained by subtraction of the volume Ve of the piezoelectric vibrator from the volume of the space of the package is Vp $$Ve/Vp > (Se \times M)/\{(Sp+Se) \times 2.72\}$$

where Se is the surface area of the piezoelectric vibrating element, Sp is the surface area of the space inside the package when the piezoelectric vibrating element inside the package is absent, and M is the maximum mass of moisture per unit volume [$\mu g/mm^3$] at the use temperature and 100% relative humidity.

22 Claims, 4 Drawing Sheets

FIG. 1 - Prior Art
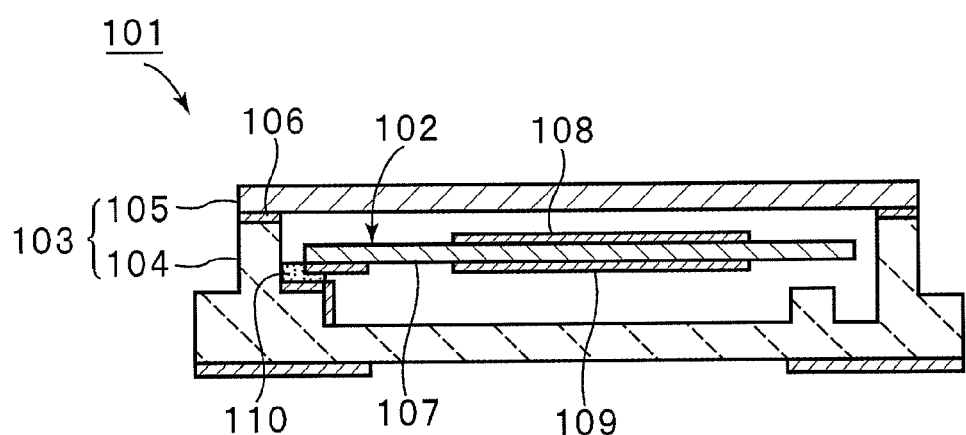
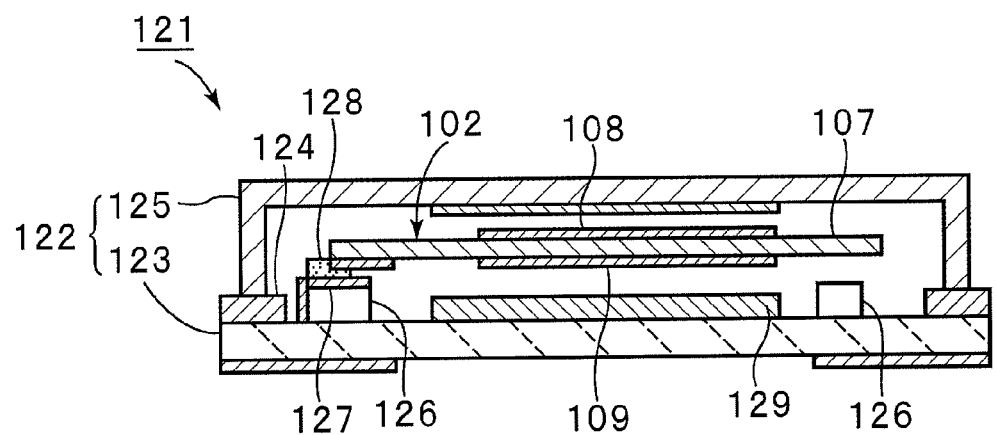
FIG. 2 - Prior Art

FIG. 3A
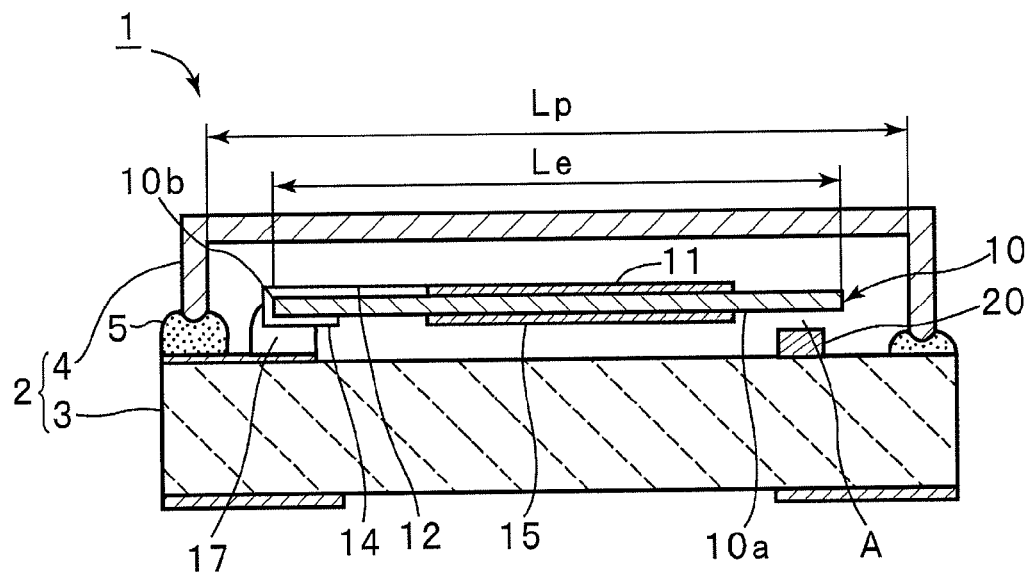
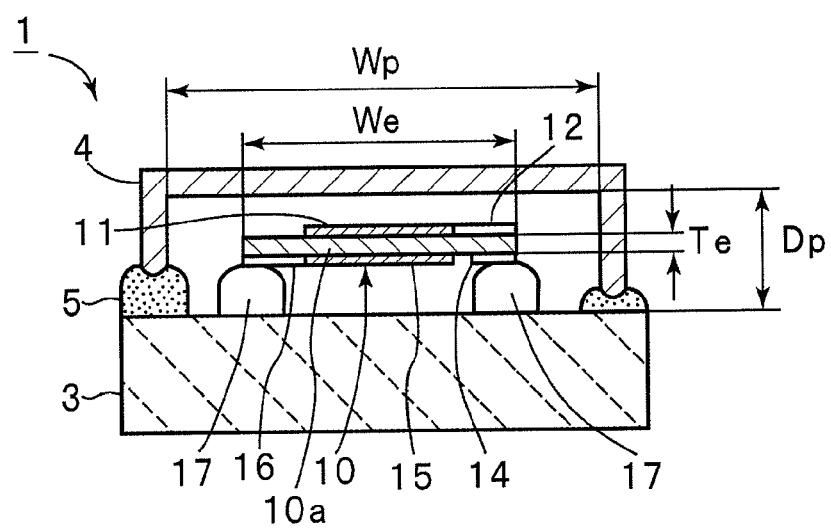
FIG. 3B

PIEZOELECTRIC VIBRATION COMPONENT

This is a continuation of application Ser. No. PCT/JP2008/068562, filed Oct. 14, 2008, the contents of which is hereby incorporated herein by reference.

TECHNICAL FIELD

The present invention relates to piezoelectric vibration components for use in oscillators or band-pass filters, and more specifically, to a piezoelectric vibration component that includes a piezoelectric vibrator accommodated in a sealed space formed inside a package.

BACKGROUND ART

Piezoelectric vibration components are widely used as oscillators or band-pass filters. In a piezoelectric vibration component, a piezoelectric vibrating element is accommodated in a package, and the accommodating space of the package is sealed. This seeks to prevent other elements from coming into contact with the piezoelectric vibrating element, and to improve environmental resistance by sealing the space in which the piezoelectric vibrating element is accommodated.

Patent Document 1 discloses a piezoelectric vibration component illustrated in FIG. 1. For a piezoelectric vibration component 101, a piezoelectric vibrating element 102 is accommodated in a package 103. The package 103 includes a first package member 104 having an upward opening and a flat-shaped second package member 105 fixed so as to close the opening of the first package member 104. The second package member 105 is bonded to an upper surface of the first package member 104 with a metallic bonding layer 106 made of solder or the like disposed therebetween, thereby hermetically sealing the package 103.

The piezoelectric vibrating element 102 includes a piezoelectric plate 107 made of quartz crystal or piezoelectric ceramic. A first excitation electrode 108 is disposed on an upper surface of the piezoelectric plate 107, and a second excitation electrode 109 is disposed on a lower surface thereof. The piezoelectric vibrating element 102 has an end fixed to the first package member 104 by the use of a conductive adhesive 110. That is, the piezoelectric vibrating element 102 is fixed to the first package member 104 in a cantilever fashion.

The above-described piezoelectric vibration component 101 is hermetically sealed. Accordingly, moisture and the like in the air is not allowed to easily enter it, so age degradation of the characteristics of the piezoelectric vibration component 101 can be mitigated.

Typically, for a piezoelectric element such as the piezoelectric vibrating element 102, if moisture in the air is deposited on the surface of the element because of a temperature change or the like, the increase in mass may reduce the Q value of the piezoelectric element or may raise resonant resistance. In particular, when the piezoelectric plate 107 made of a piezoelectric single crystal, such as quartz crystal, is used, a reduction in Q value or a rise in resonant resistance resulting from the above-described increase in mass may tend to occur. Therefore, the characteristics of the piezoelectric vibration component 101 tend to deteriorate, and if they deteriorate significantly, the element's oscillation may be stopped.

Patent Document 2 listed below discloses a piezoelectric vibration component 121 illustrated in FIG. 2. In the piezoelectric vibration component 121, the piezoelectric vibrating element 102 is accommodated in a package member 122. The package member 122 includes a flat-shaped first package member 123 and a metallic cap 125 bonded on the first package member 123 with an insulation adhesive 124 disposed therebetween. A support 126 is disposed on an upper surface of the first package member 123 integrally with or independently of the first package member 123. A terminal electrode 127 is disposed on an upper surface of the support 126. The terminal electrode 127 is coupled to an end of the piezoelectric vibrating element 102 with a conductive adhesive 128 disposed therebetween.

The package 122 for piezoelectric vibration component 121 is sealed. However, the seal is not as effective as that occurring when the metallic bonding layer 106 illustrated in FIG. 1 is used. Accordingly, water in the air may enter the inside of the package from the outside of it. To address this, Patent Document 3 listed below discloses placing a desiccant 129 in an accommodating space of piezoelectric vibration component 121. The desiccant 129 absorbs entering moisture, to suppress condensation on the surface of the piezoelectric vibrating element 102 resulting from a temperature change.

Patent Document 1: Japanese Unexamined Patent Application Publication No. 2002-198741
Patent Document 2: Japanese Unexamined Patent Application Publication No. 9-36691
Patent Document 3: Japanese Unexamined Patent Application Publication No. 6-314928

DISCLOSURE OF INVENTION

As described above, the metallic bonding layer 106 is used in the piezoelectric vibration component 101 to hermetically seal the package 102. Thus, the cost is higher and the manufacturing process tends to be more complicated, in comparison with a sealing structure using resin, such as an inexpensive insulation adhesive.

In contrast, the space inside the package is sealed by the use of the inexpensive insulation adhesive 124 for the piezoelectric vibration component 121 illustrated in FIG. 2. Therefore, the cost can be reduced.

However, moisture in the air tends to enter the inside of the package from the outside with a sealing structure that uses the insulation adhesive 124. Accordingly, moisture tends to be deposited on the surface of the piezoelectric vibrator 102 due to condensation resulting from a temperature change. This results in the need to place the desiccant 129, as illustrated in FIG. 2. Accordingly, the number of parts is inevitably increased, the manufacturing process is complicated, and the space inside the package is increased by an area required for the desiccant 129.

Additionally, when the moisture absorbency of the desiccant 129 is exceeded, moisture tends to be deposited on the surface of the piezoelectric vibrator 102. That is, if the piezoelectric vibration component 121 is placed in humid environment condensation occurs over a certain period of time, so resonant resistance may rise, and oscillation may be stopped.

In light of the above circumstances, it is an object of the present invention to provide an inexpensive piezoelectric vibration component that can mitigate degrading characteristics and stoppage of oscillation caused by deposition of moisture on the surface of a piezoelectric element due to a temperature change without increasing the cost of a sealing structure and the number of parts.

A piezoelectric vibration component according to the present invention includes a package having a fluid-tight sealed space and a piezoelectric vibrating element accommodated in the fluid-tight sealed space of the package. When the volume of the piezoelectric vibrating element is Ve and the volume within the package obtained by subtraction of the volume Ve of the piezoelectric vibrator from the volume of the space of the package is Vp, Ve/Vp satisfies the following Expression (1):

$$Ve/Vp > (Se \times M)/\{(Sp+Se) \times 2.72\} \quad \text{Expression (1)}$$

where Se is the surface area of the piezoelectric vibrating element, Sp is the surface area of the space inside the package when the piezoelectric vibrating element inside the package is removed, and M is the maximum mass of moisture per unit volume [μg/mm$^3$] at the use temperature T and a relative humidity of 100% represented by the following Expression (2):

$$M = 217 \times \{6.11 \times 10^{A}/(273.15+T)\}/1000 \quad \text{Expression (2)}$$

where A=7.5×T/(237.3+T).

The package structure of the piezoelectric vibration component according to the present invention is not particularly limited. According to a specific aspect of the present invention, the package may include a first package member, a second package member bonded to the first package member and forming the sealed space inside the first and second package members, and a bonding material bonding the first and second package members. In this case, the package can be easily formed by bonding the first package member and the second package member with the bonding material disposed therebetween. Preferably, an insulating adhesive for fluid-tight sealing the space may be used as the bonding material. In this case, the sealing structure can be formed more inexpensively, in comparison with when a metallic bonding layer is used.

According to another specific aspect of the present invention, the first package member may be a flat-shaped package member, and the second package member may be a cap member bonded on the first package member and having a downward opening. In this case, the piezoelectric vibration component according to the present invention can be easily and efficiently produced simply by bonding the cap member having the downward opening on the first package member after the piezoelectric vibration component is mounted on the flat-shaped first package member.

The above-described piezoelectric vibrating element can be made of various piezoelectric materials. According to another specific aspect of the present invention, the piezoelectric vibrating element includes a piezoelectric single crystal. When in particular, quartz crystal is used as the piezoelectric single crystal, changes in Q value and resonant resistance resulting from an increase in mass tends to occur. Accordingly, when a piezoelectric single crystal that is sensitive to changes in characteristics resulting from an increase in mass, such as quartz crystal, is used to form a piezoelectric vibrating element, a reduction in Q value and a rise in resonant resistance can be effectively mitigated with the present invention.

(Advantages)

With the piezoelectric vibration component according to the present invention, a change in resonant resistance resulting from deposition of moisture on the surface of the piezoelectric vibrating element due to a temperature change and the like is less likely to occur because the package and the piezoelectric vibrating element are formed such that Ve/Vp, which is the ratio of the volume Ve of the piezoelectric vibrating element to the above-described volume Vp within the package, satisfies Expression (1). That is, the amount of moisture deposited on the piezoelectric vibrating element is limited to a degree at which characteristics are not much affected even if moisture enters the inside of the package from the outside of the package, with the piezoelectric vibration component according to the present invention, because Ve/Vp is within the above-described specific range. Accordingly, degradation in characteristics, such as a change in resonant resistance, can be significantly reduced even with an inexpensive resin sealing structure.

Accordingly, degradation in characteristics resulting from a temperature change around a piezoelectric vibration component can be mitigated, and for a piezoelectric oscillator, for example, a fatal failure, such as oscillation stopping, can be prevented without using a complex structure, such as that in which a desiccant is placed, and without increasing costs.

BRIEF DESCRIPTION OF DRAWINGS

FIG. 1 is a front cross-sectional view that illustrates an example traditional piezoelectric vibration component.

FIG. 2 is a front cross-sectional view that illustrates another example traditional piezoelectric vibration component.

FIGS. 3A and 3B are a front cross-sectional view and a side cross-sectional view of a piezoelectric vibration component according to an embodiment of the present invention, respectively.

Figure 4:
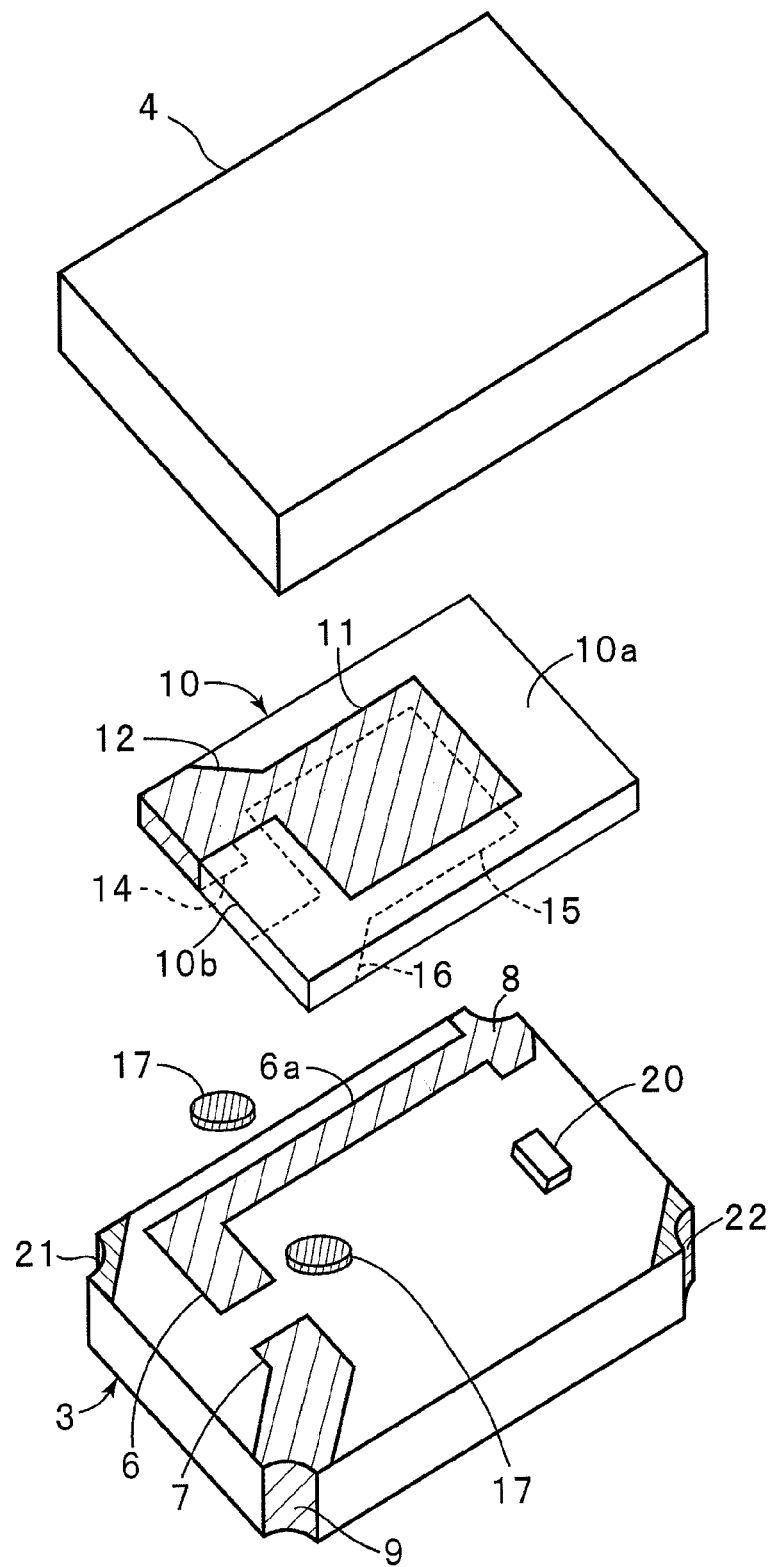
FIG. 4 is an exploded perspective view of the piezoelectric vibration component according to the embodiment illustrated in FIGS. 3A and 3B.

REFERENCE NUMERALS 1 piezoelectric vibration component
2 package
3 case substrate (first package member)
4 cap (second package member)
5 insulating adhesive
6, 7 electrode lands
6a connection wiring pattern
8, 9 terminal electrodes
10 piezoelectric vibrating element
10a piezoelectric plate
10b edge
11 first excitation electrode
12 first leading electrode
14 connection electrode
15 second excitation electrode
16 second leading electrode
17 conductive adhesive
20 support
21, 22 dummy electrodes
30 package
31 first package member
31a accommodating recess
32 lid
33 insulating adhesive

BEST MODE FOR CARRYING OUT THE INVENTION

The present invention will be clarified below by the use of description of a concrete embodiment with reference to the drawings.

FIGS. 3A and 3B are a front cross-sectional view and a side cross-sectional view of a piezoelectric vibration component according to an embodiment of the present invention, respectively, and FIG. 4 is an exploded perspective view thereof. A piezoelectric vibration component 1 includes a package 2. The package 2 includes a flat-shaped case substrate 3 as a first package member and a metallic cap 4 as a second package member. The case substrate 3 is made of alumina according to the present embodiment. The case substrate 3 may also be made of insulating ceramic other than alumina and may also be made of another insulating material, such as a plastic. The case substrate 3 may also be formed from a composite in which an insulating layer is formed on the surface of, for example, a metallic plate.

The cap 4 is made of a metal. However, it may also be formed from a composite in which the surface of a plastic is covered with a metallic film. The cap 4 may also be made of an insulating material, such as insulating ceramic or a plastic. Preferably, a cap 4 made of a metal or a composite having a surface covered with a metallic film is used to electromagnetically shield the package 2.

The cap 4 has a downward opening. The edges of the opening are bonded to the case substrate 3 with an insulating adhesive 5 disposed therebetween. This enables fluid tight shielding of the package 2. The insulating adhesive 5 is composed of an epoxy resin adhesive according to the present embodiment, is relatively inexpensive, and fluid-tight seals the space inside the package 2. The insulating adhesive 5 achieving such fluid-tight sealing is more inexpensive than, for example, the metallic bonding layer 106 achieving hermetically sealing described in Patent Document 1. Accordingly, the use of the insulating adhesive 5 can reduce the cost of the sealing structure.

As illustrated in FIG. 4, electrode lands 6 and 7 are formed on an upper surface of the case substrate 3. The electrode land 6 is electrically coupled to a first terminal electrode 8 disposed on a first corner of the case substrate 3 with a connection wiring pattern 6a disposed therebetween. At one corner of the case substrate 3, the first terminal electrode 8 is formed so as to reach a cylindrically curved side face formed by cutting of the corner from the upper surface and also to reach a lower surface of the case substrate 3. The electrode land 7 links to a terminal electrode 9 disposed on another corner diagonally opposite to the corner at which the terminal electrode 8 is disposed. The terminal electrode 9 extends to the lower surface of the case substrate 3 from a cylindrically curved side face section formed by cutting of the corner of the case substrate 3 from the upper surface.

A support 20 is formed on the upper surface of the case substrate 3. The support 20 protrudes from the upper surface of the case substrate 3 and has an upper surface extending in parallel with the upper surface of the case substrate 3. The support 20 is made of an appropriate insulating material. The support 20 may also be formed integrally with the case substrate 3. The support 20 may also be formed so as to be bonded to the upper surface of the case substrate 3 by the use of, for example, an adhesive.

Dummy electrodes 21 and 22 are formed on the remaining corners, i.e., other than the corners at which the above-described terminal electrodes 8 and 9 are formed. The dummy electrodes 21 and 22 are not necessarily required. The dummy electrodes 21 and 22 are formed so as to extend from cylindrically curved side faces formed by cutting at their respective corners to the upper surface and lower surface of the case substrate 3.

Each of the above-described electrode land 6, connection wiring pattern 6a, terminal electrode 8, electrode land 7, terminal electrode 9, and dummy electrodes 21 and 22 is made of an appropriate conductive material. In forming these electrodes, they can be formed by an appropriate thin-film forming method, such as plating, sputtering, vapor deposition, or baking.

A piezoelectric vibrating element 10 is bonded on the above-described case substrate 3 by the use of a conductive adhesive 17. A material used as the conductive adhesive 17 is not particularly limited. According to the present embodiment, a conductive adhesive in which a silver filler is contained in an epoxy resin adhesive is used. The conductive adhesive 17 enables the piezoelectric vibrating element 10 to be supported in a cantilever fashion.

As illustrated in FIG. 4, the piezoelectric vibrating element 10 includes a piezoelectric plate 10a. According to the present embodiment, the piezoelectric plate 10a is made of AT-cut quartz crystal. The piezoelectric plate 10a may also be made of a piezoelectric single crystal other than quartz crystal. The piezoelectric plate 10a need not be made of a piezoelectric single crystal, and it may also be made of piezoelectric ceramic, such as PZT ceramic.

A first excitation electrode 11 is formed on an upper surface of the piezoelectric plate 10a. A first leading electrode 12 is formed so as to link to the first excitation electrode 11.

The first leading electrode 12 is extended so as to reach an edge 10b adjacent to a portion where the piezoelectric plate 10a is bonded by the use of the conductive adhesive 17. The first leading electrode 12 reaches a side face of the piezoelectric plate 10a and is also electrically coupled to a connection electrode 14 formed on a lower surface of the piezoelectric plate 10a.

A second excitation electrode 15 is formed on the lower surface of the piezoelectric plate 10a so as to overlap the first excitation electrode 11 such that the piezoelectric plate 10a is disposed therebetween. A second leading electrode 16 is formed so as to link to the second excitation electrode 15.

The piezoelectric vibrating element 10 is vibrated in the thickness shear mode by the application of an alternating voltage between the first and second excitation electrodes 11 and 15, and resonance characteristics associated with that vibration are obtainable. To facilitate mounting of the piezoelectric vibrating element 10, the above-described support 20 is disposed in the vicinity of a free end of the piezoelectric vibrating element 10 and inwardly from the free end.

A gap is disposed between an upper surface of the support 20 and the piezoelectric vibrating element 10. The gap is not necessarily required. Disposing the support 20 can facilitate fixing the piezoelectric vibrating element 10 to the support 6. That is, collision of the leading end of the piezoelectric vibrating element 10 with the case substrate 3 can be prevented, and arranging the piezoelectric vibrating element 10 in an accurate orientation in assembling can be facilitated. The support 20 is not necessarily required.

The electrode land 6 on the upper surface of the case substrate 3 is bonded to the above-described connection electrode 14 by the use of the conductive adhesive 17. Also by the use of the conductive adhesive 17, the second leading electrode 16 of the piezoelectric vibrating element 10 is bonded to the electrode land 7.

Accordingly, the piezoelectric vibration component 1 can be surface-mounted on a printed circuit board from the lower surface side of the case substrate 3 because the terminal electrodes 8 and 9 are formed so as to extend from the above-described cylindrically curved side sections to the lower surface.

Each of the electrode patterns and wiring patterns including the above-described excitation electrodes 11 and 15 has a chrome background and a gold surface layer according to the present embodiment. However, the metals can also be other appropriate metals or alloys.

A feature of the piezoelectric vibration component 1 according to the present embodiment is that when the volume of the piezoelectric vibrating element 10 is Ve and the volume within the package obtained by subtraction of the volume Ve of the piezoelectric vibrating element 10 from the volume of the space inside the package 2 is Vp, Ve/Vp satisfies the following Expression (1):

$$Ve/Vp > (Se \times M)/\{(Sp+Se) \times 2.72\} \quad \text{Expression (1)}$$

where Se is the surface area of the piezoelectric vibrating element, Sp indicates the surface area of the above-described space inside the package in a state in which the above-described piezoelectric vibrating element in the package is removed, M is the maximum mass of moisture per unit volume ($\mu g/mm^3$) at the use temperature T and 100% relative humidity represented by the following Expression (2):

$$M = 217 \times \{6.11 \times 10^A/(273.15+T)\}/1000 \quad \text{Expression (2)}$$

where $A = 7.5 \times T/(237.3+T)$

Because Ve/Vp satisfies Expression (1), limitation of the amount of moisture that can be present in the above-described space inside the package 2 enables degradation in characteristics, such as a rise in resonant resistance, to be less likely to occur even if moisture is deposited on the piezoelectric vibrating element 10 due to a temperature change. That is, a feature of the present invention is that, while occurrence of condensation resulting from a temperature change is accepted, limitation of the amount of moisture present in the space inside the above-described package 2 enables the entry of moisture resulting from a temperature change to be reduced and degradation in characteristics to be mitigated without the use of a desiccant for absorbing moisture. This will be described more concretely.

The maximum amount of moisture stored in the volume Vp within the package 2 is $Vp \times M$ ($\mu g$) when a use temperature of the piezoelectric vibration component is T° C. That is, when the use temperature T° C. is the highest use temperature T, the maximum mass of moisture is $$Vp \times M \, (\mu g) \quad \text{Expression (3).}$$

If all of the moisture having this maximum mass of moisture condenses, the mass of moisture deposited on the surface of the piezoelectric vibrating element 10 is the value obtained by multiplying the mass of moisture represented by Expression (3) by $Se/(Se+Sp)$. Here, Se is the surface area of the piezoelectric vibrating element 10 and Sp is the surface area of the sealed space inside the package 2 in a state where the piezoelectric vibrating element 10 is removed. Accordingly, $Se/(Se+Sp)$ is the ratio of the surface area Se of the piezoelectric vibrating element 10 to all the surface area of the space inside the package 2.

As described above, the mass of moisture deposited on the surface of the piezoelectric vibrating element 10 when all of the moisture having the maximum mass of moisture condenses can be represented by the following Expression (4):

$$Vp \times M \times SE/(Se+Sp) [\mu g] \quad \text{Expression (4)}$$

An allowance for oscillation for an oscillation circuit, that is, an allowance at which oscillation is not stopped can be represented by a negative resistance value of a piezoelectric vibrating element. As described in, for example, Quartz Crystal Industry Association of Japan (QIAJ), "Suisho Devaisu no Kaisetsu to Ohyo," March, 2007, pp. 53-54, an oscillation circuit stops its oscillation when the negative resistance value is smaller than the resonant resistance. The negative resistance value is considered to need to be at least approximately five times the above-described resonant resistance. Actual oscillation circuits are set on the basis of this rule such that the negative resistance value is more than five times larger than the resonant resistance. Accordingly, if an increase in resonant resistance resulting from moisture deposited on the piezoelectric vibrating element 10 is less than 400% of the original resonant resistance, oscillation is not stopped even with the package 2 using a fluid-tight sealing structure through which moisture passes.

Figure 5:
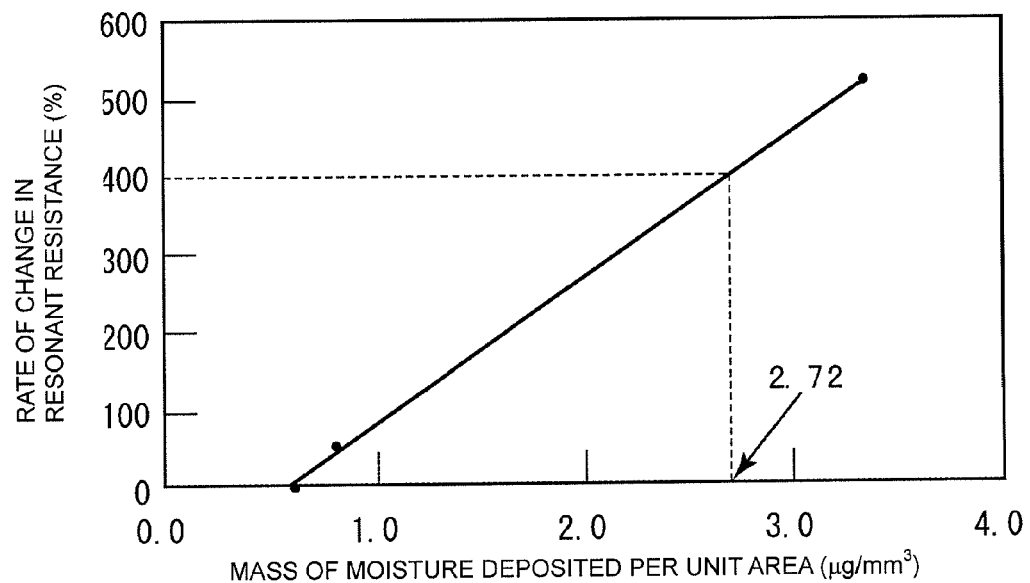
FIG. 5 illustrates a relationship between the amount of moisture deposited and the rate of change in resonant resistance for a piezoelectric vibrating element used in the embodiment illustrated in FIGS. 3A and 3B.

For a piezoelectric vibrating element, the resonant resistance linearly varies because of a change in the mass of moisture deposited. This is illustrated in FIG. 5. FIG. 5 illustrates the relationship between the mass of moisture deposited on the piezoelectric vibrating element 10 having a piezoelectric plate 10a made of quartz crystal and the rate of change in resonant resistance. As is clear from FIG. 5, it is revealed that the rate of change in resonant resistance linearly varies with respect to the mass of moisture deposited. It is also revealed that the amount of moisture deposited when the resonant resistance is increased by moisture deposition to five times the original, that is, the amount of moisture when the rate of change in resonant resistance is +400%, is $2.72 \times Ve$ [$\mu g$].

Accordingly, the condition that the amount of moisture deposited when the resonant resistance is increased to five times the original is larger than the mass of moisture deposited on the surface of the piezoelectric vibrating element 10 is met when the following Expression (5) is satisfied:

$$2.72 \times Ve > Vp \times M \times Se/(Se+Sp) \quad \text{Expression (5)}$$

Expression (5) can be modified to above-described Expression (1). Accordingly, when Ve/Vp is determined so as to satisfy Expression (1), even if moisture enters the inside of the package from the outside of the package due to a temperature change, oscillation stopping can be reliably prevented because the maximum mass of moisture storable is limited. Therefore, even with a fluid-tight sealing structure, which is an inexpensive sealing structure, oscillation is not stopped.

Next, a concrete experimental example is described.

For the above-described piezoelectric vibration component 1, its members were made of the previously described materials, and the dimensions for the constituent components are described below.

Case substrate 3: length 2.0 mm×width 1.6 mm×thickness 0.28 mm

Dimensions of piezoelectric vibrating element 10: length Le 1.3 mm×width We 0.9 mm×thickness Te 33 $\mu m$ With these dimensions, the piezoelectric vibration component 1 as a piezoelectric oscillator having the oscillation frequency 50 MHz was produced.

$$Se = (Le \times We + We \times Te + Le \times Te) \times 2 = 3.39 \, mm^2$$

(Se: Surface area of piezoelectric vibrating element 10)

$$Ve = Le \times We \times Te = 0.039$$

Inside Dimensions of cap 9: length Lp 1.62 mm×width Wp 1.22 mm×depth Dp 0.23 mm $$Vp = Lp \times Wp \times Dp - Ve = 0.416 \, mm^3$$

(Vp: Effective inside space volume of package 2)

$$Sp = (Lp \times Wp + Wp \times Dp + Lp \times Dp) \times 2 = 5.26 \, mm^2$$

(Sp: Surface area of accommodating space inside package 2)

$$Ve/Vp = 0.094 > (Se \times M)/(Sp+Se) \times 2.72 = 0.051$$

The use temperature T° C. was 85° C. Accordingly, from the above-described Expression (2), the value M is 0.352.

After the piezoelectric vibration component 1 according to the present embodiment was maintained for 168 hours at 85° C. temperature and a 100% relative humidity, it was cooled to the temperature of −55° C. and a relative humidity of 0%. In that state, the piezoelectric vibration component 1 was operated. As a result, oscillation stopping was not recognized. This means that even if all of the moisture stored at the highest use temperature T° C. and 100% relative humidity is condensed inside the package 2, oscillation is not stopped because the resonant resistance is less than five times the original.

Accordingly, degradation in characteristics and oscillation stopping can be reliably prevented even with an inexpensive sealing structure even when a piezoelectric single crystal that is sensitive to a change of an increase in mass resulting from a temperature change, such as quartz crystal, is used. Traditionally, when a material of that sensitively reacts to an external cause and changes its characteristics, such as quartz crystal, is used, the use of an expensive air-tight sealing structure has been considered to be necessary. In contrast, entry of moisture into a package is accepted with the present invention, and stable frequency characteristics can be achieved by limitation of the amount of moisture that can be present inside the package.

Figure 6:
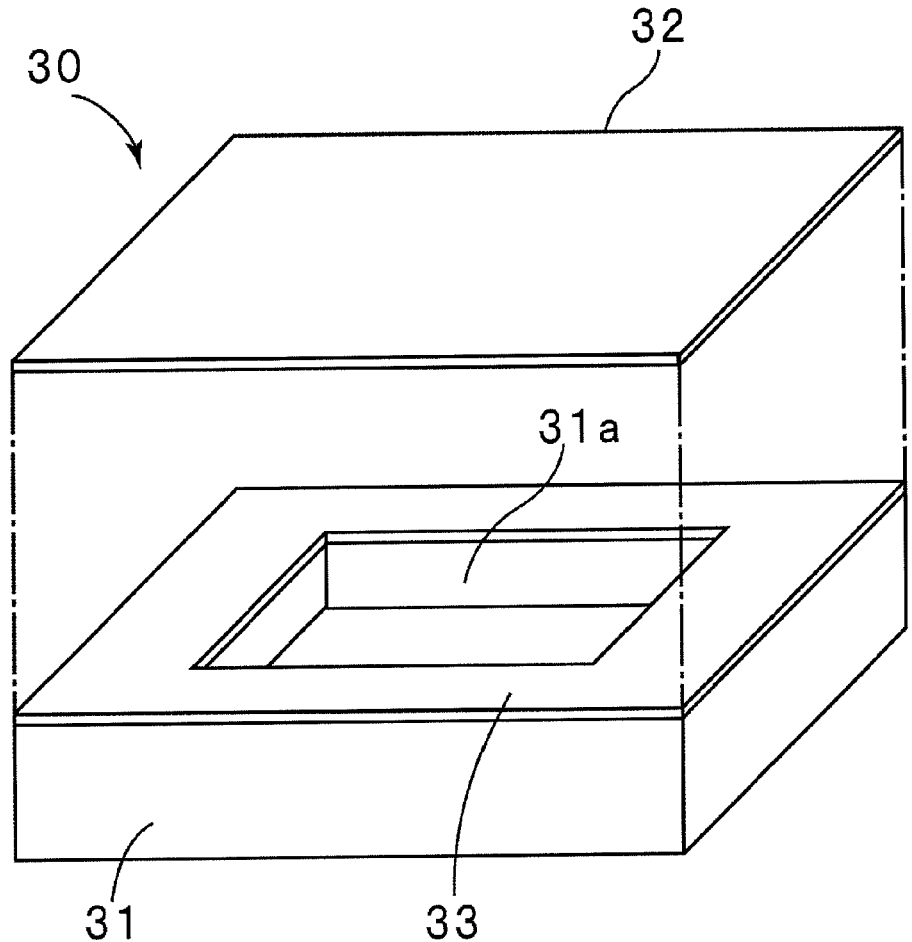
FIG. 6 is an exploded perspective view for use in describing a modified example of a package structure.

With the above-described embodiment, a first package member composed of the flat-shaped case substrate 3 and a second package member composed of the cap 4 having a downward opening are used. However, other package structures may also be used. For example, as illustrated in FIG. 6, a package 30 may be used in which a first package member 31 made of insulating ceramic or plastic and having an upwardly opened accommodating recess 31a and a flat-shaped lid 32 as a second package member are bonded together with an insulating adhesive 33 disposed therebetween.

Additionally, a package into which another package member other than the first and second package members is combined may also be configured in the present invention. A support fashioned for a piezoelectric vibrator accommodated in an inner space is also not limited to a cantilever fashion. Additionally, the accommodated piezoelectric vibrating element may also be a piezoelectric vibrating element that forms a band-pass filter.

The invention claimed is:

1. A piezoelectric vibration component comprising:
a package having a space sealed by a resin adhesive which permits the entry of moisture and in which space there is moisture;
a piezoelectric vibrating element accommodated in the sealed space of the package,
wherein, when the volume of the piezoelectric vibrating element is Ve and the volume within the package obtained by subtraction of the volume Ve of the piezoelectric vibrator from the volume of the space of the package is Vp, $$Ve/Vp > (Se \times M) / \{(Sp+Se) \times 2.72\}$$

where Se is the surface area of the piezoelectric vibrating element, Sp is the surface area of the space inside the package when the piezoelectric vibrating element is absent, and M is the maximum mass of moisture in $\mu g/mm^3$ at the use temperature T and 100% relative humidity and $$M = 217 \times \{6.11 \times 10^4 / (273.15+T)\}/1000$$

where $A = 7.5 \times T/(237.3+T)$.

2. The piezoelectric vibration component according to claim 1, comprising a first package member, a second package member, and a bonding material bonding the first and second package members together, and the first and second package members are configured to define the sealed space when bonded together.

3. The piezoelectric vibration component according to claim 2, wherein the bonding material comprises an insulating adhesive for sealing the space.

4. The piezoelectric vibration component according to claim 3, wherein the first package member is a flat-shaped package member, and the second package member is a cap member bonded on the first package member and having a downward opening.

5. The piezoelectric vibration component according to claim 4, wherein the piezoelectric vibrating element comprises a piezoelectric single crystal.

6. The piezoelectric vibration component according to claim 5, wherein the piezoelectric single crystal comprises quartz crystal.

7. The piezoelectric vibration component according to claim 1, wherein the bonding material comprises an insulating adhesive for sealing the space.

8. The piezoelectric vibration component according to claim 7, wherein the first package member is a flat-shaped package member, and the second package member is a cap member bonded on the first package member and having a downward opening.

9. The piezoelectric vibration component according to claim 8, wherein the cap member comprises a metallic film electromagnetically shielding the package.

10. The piezoelectric vibration component according to claim 9, wherein the piezoelectric vibrating element comprises a piezoelectric single crystal.

11. The piezoelectric vibration component according to claim 10, wherein the piezoelectric single crystal comprises quartz crystal.

12. The piezoelectric vibration component according to claim 11, wherein the piezoelectric vibration element is cantilever supported on the flat-shaped package member.

13. The piezoelectric vibration component according to claim 12, wherein an exterior surface of the flat shaped package member has a terminal electrode thereon which is in electrical communication with the piezoelectric vibration element.

14. The piezoelectric vibration component according to claim 8, wherein the piezoelectric vibrating element comprises a piezoelectric single crystal.

15. The piezoelectric vibration component according to claim 14, wherein the piezoelectric single crystal comprises quartz crystal.

16. The piezoelectric vibration component according to claim 1, wherein the package comprises a first flat-shaped package member, and a second package member which is a cap member having a downward opening bonded on the first package member so as to define the space.

17. The piezoelectric vibration component according to claim 16, wherein the piezoelectric vibrating element comprises a piezoelectric single crystal.

18. The piezoelectric vibration component according to claim 17, wherein the piezoelectric single crystal comprises quartz crystal.

19. The piezoelectric vibration component according to claim 1, wherein the piezoelectric vibrating element comprises a piezoelectric single crystal.

20. The piezoelectric vibration component according to claim 19, wherein the piezoelectric single crystal comprises quartz crystal.

21. The piezoelectric vibration component according to claim 1, wherein the piezoelectric vibrating element is an AT-cut quartz crystal.

22. The piezoelectric vibration component according to claim 1, wherein the use temperature T is 85° C.

* * * * *